United States Patent
Lin et al.

(10) Patent No.: US 7,609,018 B2
(45) Date of Patent: Oct. 27, 2009

(54) FAN SYSTEM AND CONTROL DEVICE THEREOF

(75) Inventors: Yu-Liang Lin, Taoyuan Hsien (TW); Tsung-Jung Hsieh, Taoyuan Hsien (TW); Yueh-Lung Huang, Taoyuan Hsien (TW); Ming-Shi Tsai, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 123 days.

(21) Appl. No.: 11/898,899

(22) Filed: Sep. 17, 2007

(65) Prior Publication Data

US 2008/0074275 A1   Mar. 27, 2008

(30) Foreign Application Priority Data

Sep. 22, 2006   (TW) .............................. 95135070 A

(51) Int. Cl.
    *G05D 23/00* (2006.01)
(52) U.S. Cl. .................. 318/471; 318/461; 388/934; 388/821
(58) Field of Classification Search .......... 318/471, 318/461, 432; 388/800, 806, 821, 822, 934
    See application file for complete search history.

(56) References Cited

U.S. PATENT DOCUMENTS

| | | | | |
|---|---|---|---|---|
| 4,717,811 A * | 1/1988 | Fujii | ........................ | 219/497 |
| 5,197,858 A * | 3/1993 | Cheng | ........................ | 417/14 |
| 5,457,766 A * | 10/1995 | Ko | ........................ | 388/831 |
| 6,040,668 A * | 3/2000 | Huynh et al. | ........................ | 318/471 |
| 6,396,231 B1 * | 5/2002 | Horng et al. | ........................ | 318/471 |
| 6,943,517 B2 * | 9/2005 | Yoshitomi et al. | ........................ | 318/471 |

* cited by examiner

*Primary Examiner*—Rina I Duda
(74) *Attorney, Agent, or Firm*—Birch, Stewart, Kolasch & Birch, LLP

(57) ABSTRACT

A control device of a fan system includes a temperature sensing module, a comparing module and a driving module. The temperature sensing module senses an external temperature and generates a sensing signal according to the external temperature. The comparing module receives the sensing signal and outputs a comparing signal according to the sensing signal and a reference voltage signal. The driving module, which is electrically connected with the temperature sensing module and the comparing module, supplies a working voltage to the temperature sensing module and the comparing module, and outputs a rotating speed control signal according to the sensing signal or the comparing signal.

20 Claims, 4 Drawing Sheets

FAN SYSTEM AND CONTROL DEVICE THEREOF

CROSS REFERENCE TO RELATED APPLICATIONS

This Non-provisional application claims priority under 35 U.S.C. §119(a) on Patent Application No. 095135070 filed in Taiwan, Republic of China on Sep. 22, 2006, the entire contents of which are hereby incorporated by reference.

BACKGROUND OF THE INVENTION

1. Field of Invention

The invention relates to a system and a control device thereof, and in particular, to a fan system and a control device thereof.

2. Related Art

Because the performance and the processing speed of electronic devices are increased and the integration of the used electronic components is increased, the requirement in heat dissipation is greatly increasing. In one solution, a fan is installed in the electronic device to dissipate the heat. A control device of the fan adjusts the rotating speed of the fan according to the environment temperature. The environment temperature is usually sensed by a temperature sensing member, such as a thermister. The thermister is a resistor, which is sensitive to the temperature variation and changes its resistance value with the temperature variation. The thermisters may be classified into a positive temperature coefficient (PTC) thermister and a negative temperature coefficient (NTC) thermister under the correlation between the temperature and the resistance value. The resistance value of the PTC thermister increases when the temperature rises, while the resistance value of the NTC thermister decreases when the temperature rises. The thermisters have been widely used in the electronic devices to serve as temperature sensing members to facilitate the control and compensation of the circuit.

Referring to FIG. 1, a conventional fan system 1 includes a sensing module 11, a driving module 12 and a motor 13, and the sensing module 11 has a resistor R and a thermister RTH. The resistor R has a first end for receiving a working voltage V1 of the driving module 12, and a second end electrically connected with one end of the thermister RTH. The thermister RTH changes its resistance value according to the variation of an external temperature. The thermister RTH and the resistor R divide the working voltage V1 to generate a sensing signal S1, which is transferred to the driving module 12. The driving module 12 generates a control signal S2 according to the sensing signal S1, which is a voltage value, to control the rotating speed of the motor 13. In this example, the driving module 12 is a chip and has a plurality of pins including a pin VREG for providing the working voltage V1 and a pin VTH for receiving the sensing signal S1.

However, when the fan system 1 is being operated, assembled or installed, the thermister RTH may be detached from the fan system 1 or broken due to the influence of vibrations or external forces. Thus, the fan system 1 cannot change the rotating speed with the temperature variation, and the motor 13 keeps the original rotating speed. If the fan system 1 continues operating, the temperature gradually rises but the motor 13 still keeps the same rotating speed. Thus, the fan system 1 is overheated and thus damaged, the reliability and the use efficiency are decreased, and the cost is increased because the fan system has to be changed frequently.

At present, in order to improve the above-mentioned method, when the thermister RTH is detached or broken, the rotating speed of the motor 13 is configured to be the full speed. To achieve this object, the thermister RTH having the resistance value, such as 5KΩ, has to be selected, and the resistance value of the resistor R has to be smaller than 5KΩ. Thus, when the thermister RTH is detached or broken, the current flowing into the driving module 12 (VTH) is high enough because the resistance value of the resistor R is very small. Thus, the driving module 12 can generate the control signal S2 to control the motor 13 to rotate at the full speed. The resistance value of the thermister RTH required in this method is smaller, so the selection is limited.

As shown in FIG. 2, another conventional fan system 1A is to supply a power V2 with 12 volts to the sensing module 11. The motor 13 is controlled to rotate at the full speed when the thermister RTH is detached or broken regardless of the amounts of the resistance values of the thermister RTH and the resistor R. However, when the thermister RTH is not detached or broken, its resistance value gets larger as the sensed temperature gets lower. Thus, after the thermister RTH and the resistor R divide the power V2, the value of the generated sensing signal S1 will be higher than a preset voltage in the driving module 12, thereby directly making the motor 13 rotate at the full speed. Such a condition, in which the environment temperature is low but the rotating speed of the fan is kept at the full speed, not only wastes the energy but also deviates from the originally designed function.

Thus, it is an important subject to provide a fan system and a control device thereof capable of keeping a motor to rotate at a full speed to protect the fan system when a temperature sensing member of the fan system is abnormal, i.e. when the sensing member is detached or broken.

SUMMARY OF THE INVENTION

In view of the foregoing, the invention it to provide a fan system and a control device thereof capable of keeping a rotating speed of a motor at a full speed in order to protect the fan system when a temperature sensing member of the fan system gets abnormal, i.e. when the sensing member is detached or broken.

To achieve the above, the invention discloses a control device of a fan system that includes a temperature sensing module, a comparing module and a driving module. The temperature sensing module senses an external temperature so as to generate a sensing signal. The comparing module receives the sensing signal and outputs a comparing signal according to the sensing signal and a reference voltage signal. The driving module is electrically connected with the temperature sensing module and the comparing module. The driving module supplies a working voltage to the temperature sensing module and the comparing module, and outputs a rotating speed control signal according to the sensing signal or the comparing signal.

To achieve the above, the invention also discloses a fan system including a control device and a motor. The control device includes a temperature sensing module, a comparing module and a driving module. The temperature sensing module senses an external temperature so as to generate a sensing signal. The comparing module receives the sensing signal and outputs a comparing signal according to the sensing signal and a reference voltage signal. The driving module is electrically connected with the temperature sensing module and the comparing module, supplies a working voltage to the temperature sensing module and the comparing module, and outputs a rotating speed control signal according to the sensing signal or the comparing signal. The motor receives the rotating speed control signal and is controlled to rotate according to the rotating speed control signal.

As mentioned above, in the fan system and the control device thereof according to the invention, a temperature sensing module of the control device can sense an external temperature to generate a sensing signal, a comparing module compares the sensing signal with its reference voltage signal and then outputs a comparing signal, and a driving module controls a rotation speed of a motor according to the sensing signal or the comparing signal. Compared with the prior art, the reference voltage signal and the sensing signal are compared with each other so that it is possible to judge whether the fan system is in the normal state in the fan system and its control device according to the invention. In addition, when the reference voltage signal is lower than the sensing signal, which is an abnormal state of the fan system, a rotating speed control signal for making the motor rotate at the full speed is generated. This method not only uses the comparing module to compare the reference voltage signal with the sensing signal to judge whether the fan system is in the normal state, but also controls the motor to rotate at the full speed when the fan system is in the abnormal state. Thus, the overall operation of the fan system can be protected, and the reliability and the use efficiency of the fan system can be enhanced.

BRIEF DESCRIPTION OF THE DRAWINGS

The invention will become more fully understood from the subsequent detailed description and the accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
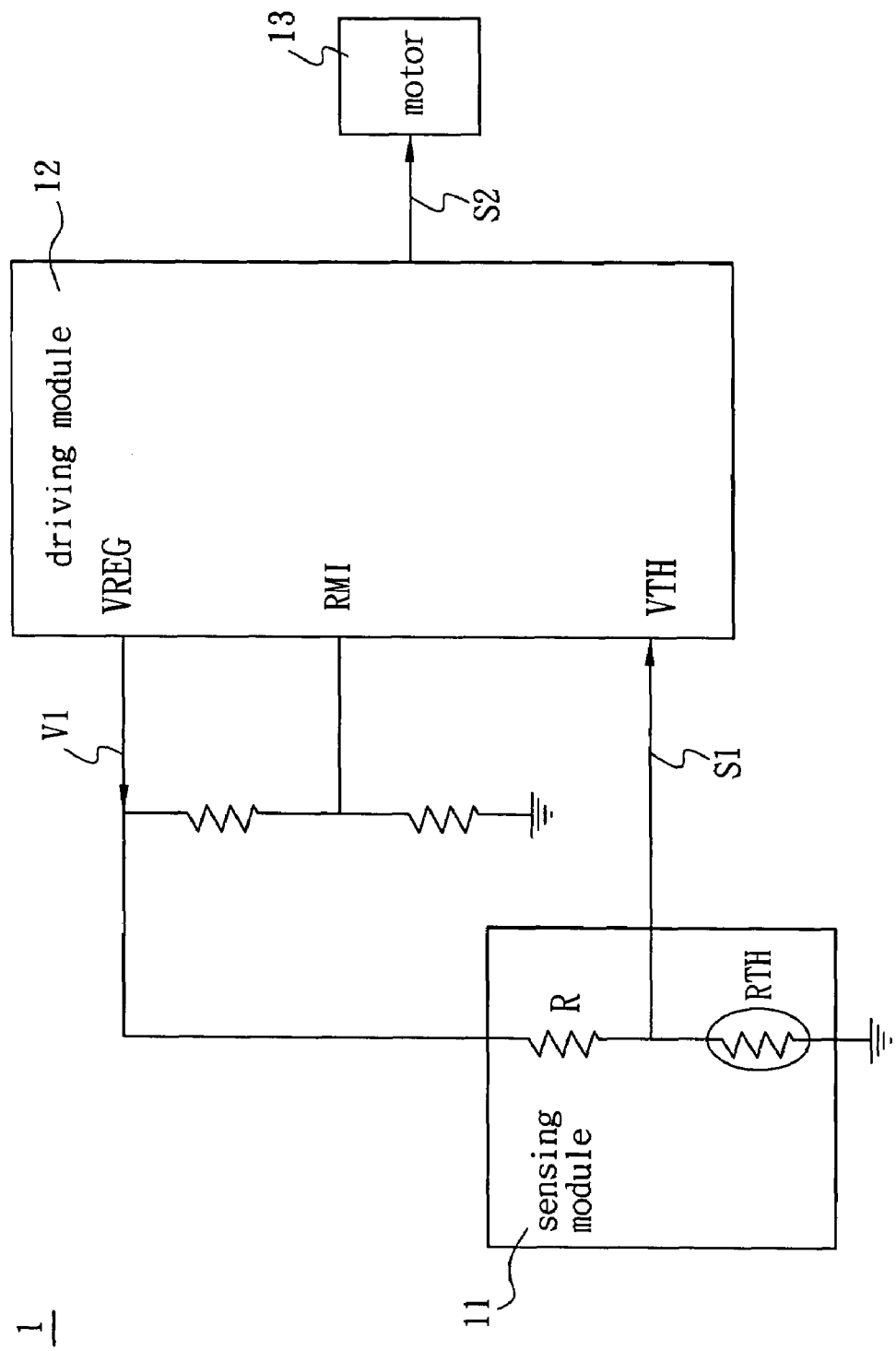
FIG. 1 is a schematic illustration showing a conventional fan system.
Figure 2:
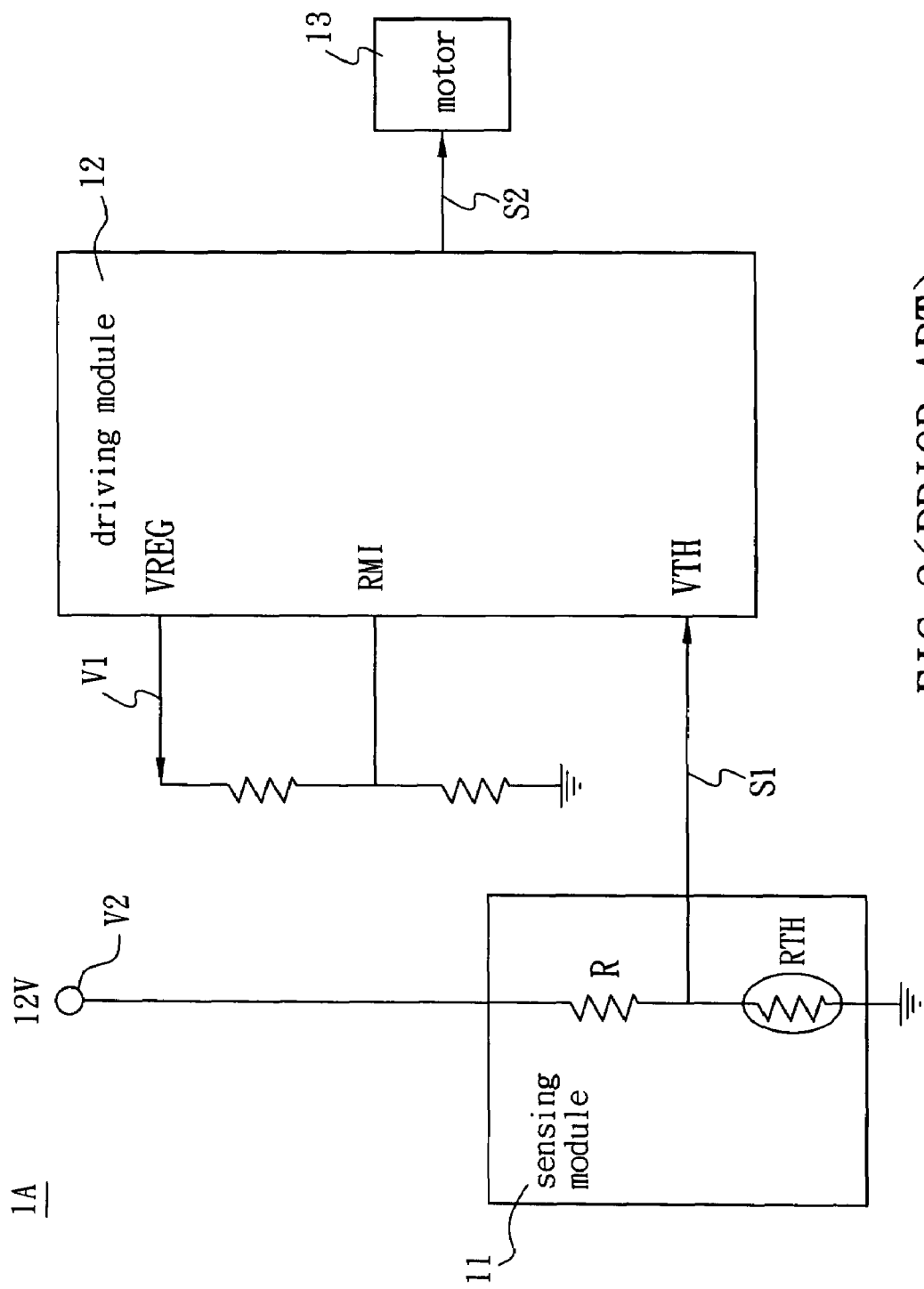
FIG. 2 is a schematic illustration showing another conventional fan system.
Figure 3:
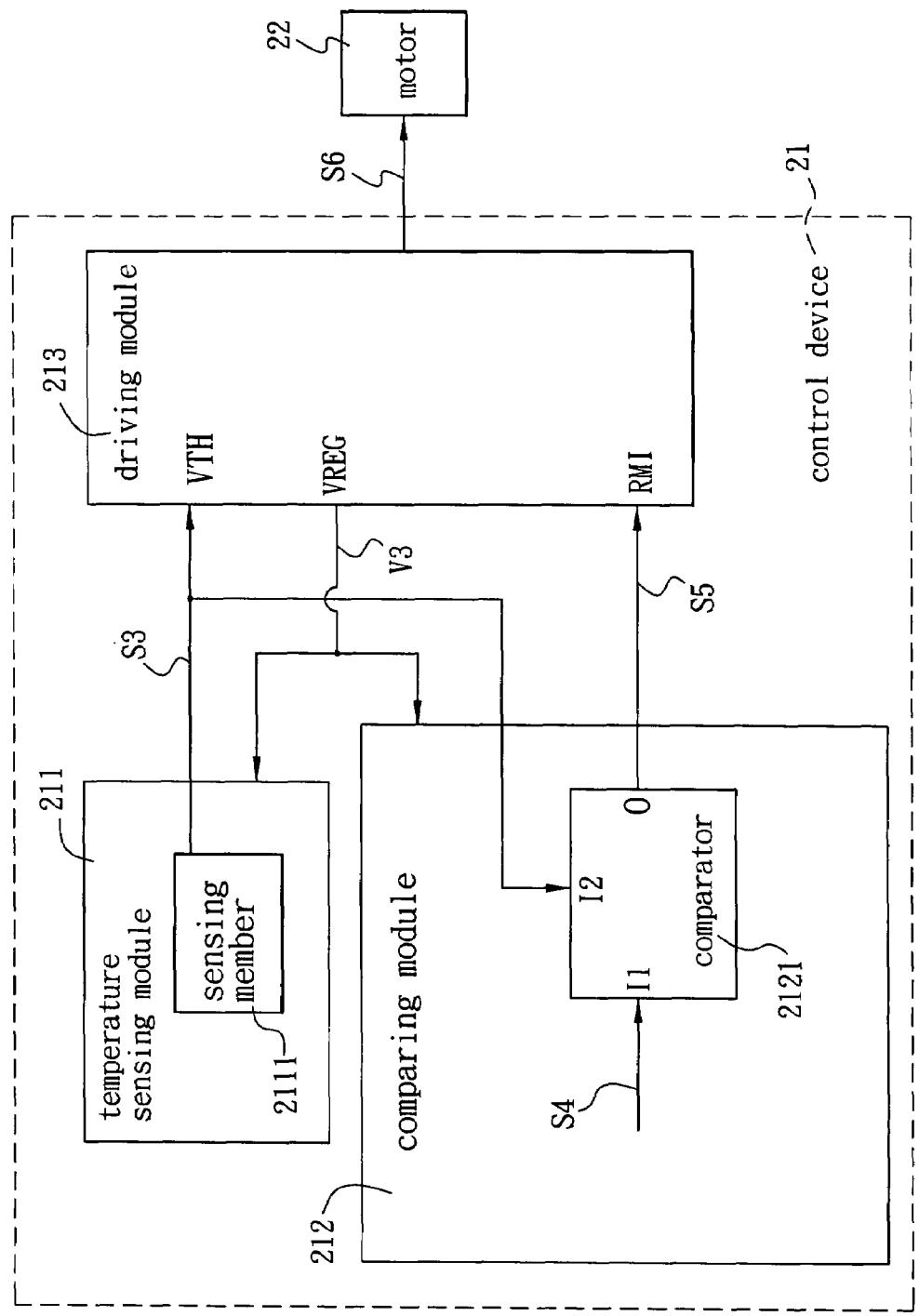
FIG. 3 is a schematic illustration showing a fan system according to an embodiment of the invention.

Referring to FIG. 3, a fan system 2 according to an embodiment of the invention includes a control device 21 and a motor 22. In this embodiment, the control device 21 has a temperature sensing module 211, a comparing module 212 and a driving module 213.

The temperature sensing module 211 has a sensing member 2111 for sensing an external temperature and generating a sensing signal S3 according to the external temperature. The sensing member 2111 is, for example but not limited to, a thermister in practice. Herein, the sensing member 2111 is a negative temperature coefficient (NTC) thermister, for example. In addition, the sensing signal S3 is, for example but not limited to, a voltage value.

The comparing module 212 has a comparator 2121, which is electrically connected with the temperature sensing module 211 and has a first input terminal I1, a second input terminal I2 and an output terminal O. The comparing module 212 receives a reference voltage signal S4 through the first input terminal I1 of the comparator 2121, the second input terminal I2 receives the sensing signal S3, and the comparator 2121 compares a value of the sensing signal S3 with that of the reference voltage signal S4 and outputs a comparing signal S5 from the output terminal O according to the compared result. In practice, the reference voltage signal S4 is, for example but not limited to, a voltage value. The comparator 2121 is, for example but not limited to, an operational amplifier. The comparing signal S5 may be a high level signal or a low level signal in practice.

The driving module 213 has a first end, a second end and a third end. The driving module 213 is, for example but not limited to, a microprocessor or a chip. The driving module 213 has a plurality of pins. In implementation, the first end is a VTH pin, the second end is a RMI pin, and the third end is a VREG pin. In this embodiment, the driving module 213 is electrically connected with the temperature sensing module 211 and the comparing module 212 so that the first end receives the sensing signal S3, and the second end receives the comparing signal S5 and outputs a rotating speed control signal S6 according to the sensing signal S3 or the comparing signal S5. In addition, the driving module 213 generates a working voltage V3, which is to be supplied to the temperature sensing module 211 and the comparing module 212, through the third end. In addition, the reference voltage signal S4 has to be lower than the working voltage V3 in a normal state.

In addition, in the driving module 213 of this embodiment, when the second end receives the comparing signal S5, which is a low level signal, the circuit in the second end is grounded so that the rotating speed control signal S6 controls the motor 22 to rotate at a full speed.

As shown in FIG. 3, the motor 22 receives the rotating speed control signal S6 in this embodiment, and controls the rotating speed of the motor 22 according to the rotating speed control signal S6.

Figure 4:
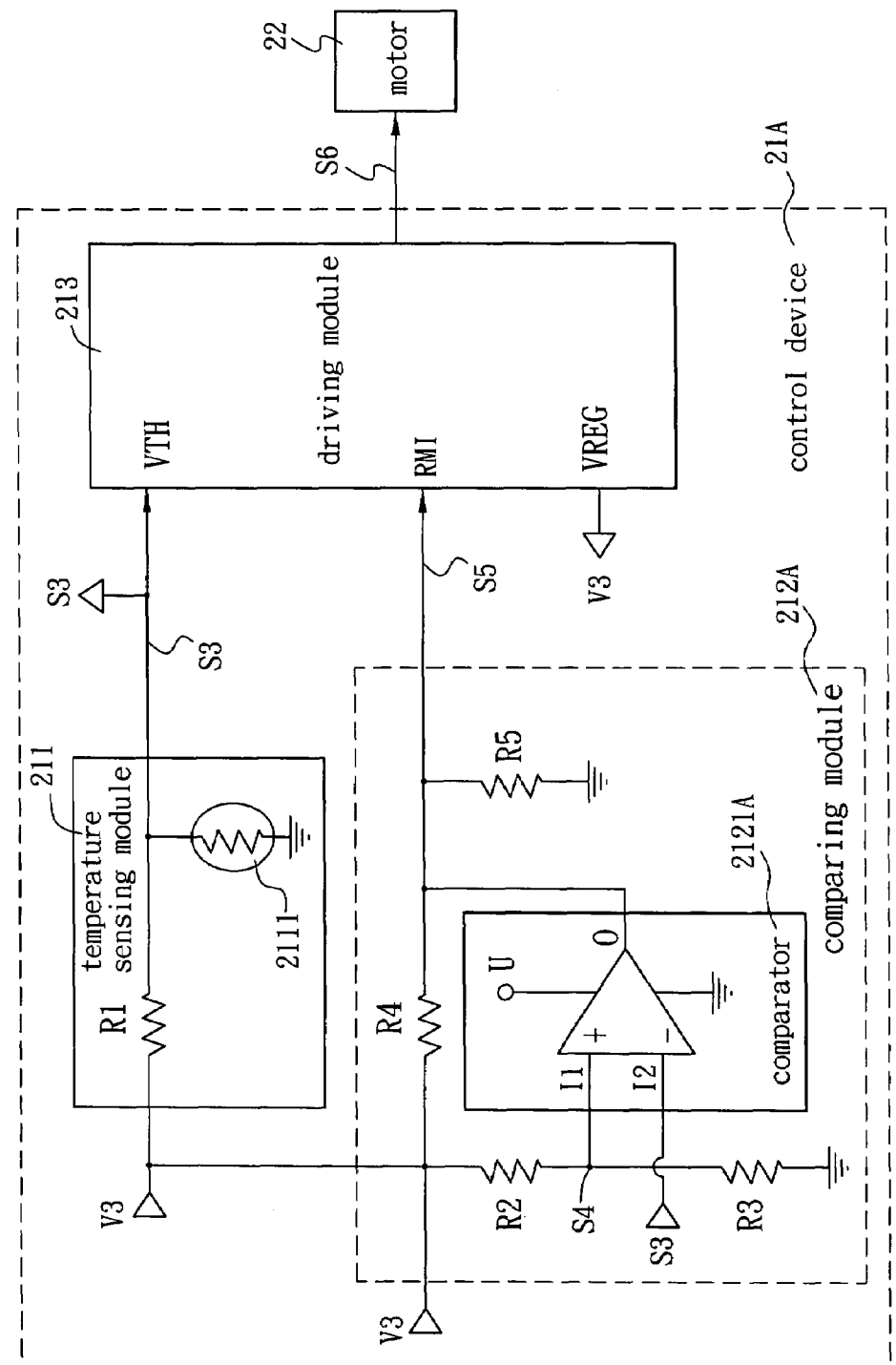
FIG. 4 shows a fan system according to another embodiment of the invention, wherein schematic circuit diagrams of a temperature sensing module and a comparing module are shown.

FIG. 4 shows a fan system 2A according to another embodiment of the invention. As shown in FIG. 4, the temperature sensing module 211 includes a first resistor R1 and the sensing member 2111. A first end of the first resistor R1 receives the working voltage V3 of the driving module 213. A first end of the sensing member 2111 is electrically connected with a second end of the first resistor R1 and generates the sensing signal S3 after conversion. A second end of the sensing member 2111 is grounded.

The comparing module 212A includes the comparator 2121A, a second resistor R2, a third resistor R3, a fourth resistor R4 and a fifth resistor R5. The comparator 2121A has the first input terminal I1, the second input terminal I2 and the output terminal O. The comparing manner and the compared result of the comparator 2121A of this embodiment have been described hereinabove, so detailed descriptions thereof will be omitted. In this circuit as shown in FIG. 4, the second resistor R2 has a first end for receiving the working voltage V3, and a second end electrically connected with the first input terminal I1. The third resistor R3 has a first end electrically connected with the first input terminal I1 to generate the reference voltage signal S4, and a second end grounded. The fourth resistor R4 has a first end for receiving the working voltage V3, and a second end electrically connected with the output terminal O. The fifth resistor R5 has one end electrically connected with the second end of the fourth resistor R4 and the output terminal O, and a second end grounded. The second resistor R2 and the third resistor R3 of this embodiment divide a working voltage VREG to generate the reference voltage signal S4, and the fourth resistor R4 and the fifth resistor R5 divide the voltage outputted from the comparator 2121A to generate the comparing signal S5.

As shown in FIG. 4, the motor 22 receives the rotating speed control signal S6 in this embodiment, and controls the rotating speed of the motor 22 according to the rotating speed control signal S6.

As shown in FIG. 4, the fan system 2A works as follows. When the fan system 2A is in the normal state, which is that the sensing member 2111 is not forced to break or loosen, the sensing member 2111 senses the external temperature and divides the voltage to generate the sensing signal S3 using the first resistor R1 and the sensing member 2111. The temperature sensing module 211 outputs the sensing signal S3 to the driving module 213 and the comparing module 212A, and the second resistor R2 and the third resistor R3 of the comparing module 212A divide the working voltage V3, which is supplied from the driving module 213, to generate the reference voltage signal S4. The comparator 2121A receives the reference voltage signal S4 through the first input terminal I1, and the second input terminal I2 receives the sensing signal S3 so that the values of the reference voltage signal S4 and the sensing signal S3 can be compared. The reference voltage signal S4 of the fan system 2 is greater than the sensing signal S3 and smaller than the working voltage V3. The comparator 2121A outputs the comparing signal S5 from the output terminal O. Then, the fourth resistor R4 and the fifth resistor R5 divide the voltage of the comparing signal S5, and the divided voltage is then transferred to the driving module 213. According to the property of the driving module 213, the driving module 213 generates the rotating speed control signal S6 to control the rotating speed of the motor 22 only according to the value of the sensing signal S3 in this state.

When the sensing member 2111 is broken or loosened, the value of the sensing signal S3 after the working voltage V3 passes through the first resistor R1 is almost the same as the working voltage V3. Thus, the reference voltage signal S4 is lower than the sensing signal S3 at this time, and the comparing signal S5 outputted from the output terminal O of the comparator 2121A is the low level signal. According to the property of the driving module, the driving module 213 generates the rotating speed control signal S6 only according to the comparing signal S5 to control the motor 22 to rotate at the full speed.

The comparing module 212A of the control device 21A compares the value of the reference voltage signal S4 with that of the sensing signal S3 in the fan system 2. Thus, when the reference voltage signal S4 is higher than the sensing signal S3 and lower than the working voltage, which means that the fan system 2A is in the normal state, the driving module 213 can generate the rotating speed control signal S6 according to the sensing signal S3 to control the rotating speed of the motor 22. Alternatively, when the sensing member 2111 is detached or broken, the reference voltage signal S4 is lower than the sensing signal S3, and the driving module 213 can control the motor 22 to rotate at the full speed according to the comparing signal S5.

In this manner, the comparing module 212A can compare the value of the reference voltage signal S4 with that of the sensing signal S3 to judge whether the sensing member 2111 is detached or broken. Furthermore, when the sensing member 2111 is detached or broken and cannot sense the temperature, the motor 22 of the fan system 2A would not be influenced and rotates at the full speed. Therefore, the overall operation of the fan system 2A can be protected, and the reliability and the use efficiency of the fan system 2A can further be enhanced.

In summary, in the fan system and the control device thereof according to the invention, a temperature sensing module of the control device can sense an external temperature to generate a sensing signal, a comparing module compares the sensing signal with its reference voltage signal and then outputs a comparing signal, and a driving module controls a rotation speed of a motor according to the sensing signal or the comparing signal. Compared with the prior art, the reference voltage signal and the sensing signal are compared with each other so that it is possible to judge whether the fan system is in the normal state in the fan system and its control device according to the invention. In addition, when the reference voltage signal is lower than the sensing signal, which is an abnormal state of the fan system, a rotating speed control signal for making the motor rotate at the full speed is generated. This method not only uses the comparing module to compare the reference voltage signal with the sensing signal to judge whether the fan system is in the normal state, but also controls the motor to rotate at the full speed when the fan system is in the abnormal state. Thus, the overall operation of the fan system can be protected, and the reliability and the use efficiency of the fan system can be enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A control device of a fan system, comprising:
   a temperature sensing module for sensing an external temperature so as to generate a sensing signal;
   a comparing module for receiving the sensing signal and outputting a comparing signal according to the sensing signal and a reference voltage signal; and
   a driving module electrically connected with the temperature sensing module and the comparing module for supplying a working voltage to the temperature sensing module and the comparing module and outputting a rotating speed control signal according to the sensing signal or the comparing signal when the fan system is in a normal state,
   wherein when the fan system is in an abnormal state, the rotating speed control signal makes a motor of the fan system rotate at the full speed, wherein the abnormal state represents that a sensing member of the temperature sensing module is detached or broken.

2. The device according to claim 1, wherein when the reference voltage signal is higher than the sensing signal, the comparing signal is a high level signal.

3. The device according to claim 2, wherein the reference voltage signal is lower than the working voltage.

4. The device according to claim 1, wherein when the reference voltage signal is lower than the sensing signal, the comparing signal is a low level signal.

5. The device according to claim 1, wherein the sensing member is used for sensing the external temperature and generating the sensing signal according to the external temperature.

6. The device according to claim 1, wherein the temperature sensing module has a first resistor having a first end for receiving the working voltage, and the sensing member having a first end electrically connected with a second end of the first resistor so as to generate the sensing signal, and a second end grounded.

7. The device according to claim 6, wherein the sensing member is a positive temperature coefficient thermister or a negative temperature coefficient thermister.

8. The device according to claim 1, wherein the comparing module has a comparator having a first input terminal for receiving the reference voltage signal, a second input terminal for receiving the sensing signal, and an output terminal for outputting the comparing signal after the comparator compares the reference voltage signal with the sensing signal.

9. The device according to claim 1, wherein the comparing module comprises:
   a comparator having a first input terminal, a second input terminal for receiving the sensing signal, and an output terminal for outputting the comparing signal;
   a second resistor having a first end for receiving the working voltage, and a second end electrically connected with the first input terminal of the comparator;
   a third resistor having a first end electrically connected with the first input terminal of the comparator to generate the reference voltage signal, and a second end grounded;
   a fourth resistor having a first end for receiving the working voltage, and a second end electrically connected with the output terminal of the comparator; and
   a fifth resistor having a first end electrically connected with the second end of the fourth resistor and the output terminal of the comparator, and a second end grounded.

10. The device according to claim 9, wherein the comparator is an operational amplifier, and the driving module comprises a microprocessor or a chip.

11. A fan system comprising:
   a control device comprising a temperature sensing module, a comparing module and a driving module, wherein the temperature sensing module senses an external temperature so as to generate a sensing signal, the comparing module receives the sensing signal and outputs a comparing signal according to the sensing signal and a reference voltage signal, and the driving module is electrically connected with the temperature sensing module and the comparing module, supplies a working voltage to the temperature sensing module and the comparing module, and outputs a rotating speed control signal according to the sensing signal or the comparing signal when the fan system is in a normal state; and
   a motor receiving the rotating speed control signal and controlled to rotate according to the rotating speed control signals,
   wherein when the fan system is in an abnormal state, the rotating speed control signal makes the motor rotate at the full speed, wherein the abnormal state represents that a sensing member of the temperature sensing module is detached or broken.

12. The fan system according to claim 11, wherein when the reference voltage signal is higher than the sensing signal, the comparing signal is a high level signal.

13. The fan system according to claim 12, wherein the reference voltage signal is lower than the working voltage.

14. The fan system according to claim 11, wherein when the reference voltage signal is lower than the sensing signal, the comparing signal is a low level signal.

15. The fan system according to claim 11, wherein the sensing member is used for sensing the external temperature and generating the sensing signal according to the external temperature.

16. The fan system according to claim 11, wherein the temperature sensing module has the first resistor having a first end for receiving the working voltage, and the sensing member having a first end electrically connected with a second end of the first resistor so as to generate the sensing signal, and a second end grounded.

17. The device according to claim 16, wherein the sensing member is a positive temperature coefficient thermister or a negative temperature coefficient thermister.

18. The fan system according to claim 11, wherein the comparing module has a comparator having a first input terminal for receiving the reference voltage signal, a second input terminal for receiving the sensing signal, and an output terminal for outputting the comparing signal after the comparator compares the reference voltage signal with the sensing signal.

19. The fan system according to claim 18, wherein the comparator is an operational amplifier.

20. The fan system according to claim 11, wherein the comparing module comprises:
   a comparator having a first input terminal, a second input terminal for receiving the sensing signal, and an output terminal for outputting the comparing signal;
   a second resistor having a first end for receiving the working voltage, and a second end electrically connected with the first input terminal;
   a third resistor having a first end electrically connected with the first input terminal of the comparator to generate the reference voltage signal, and a second end grounded;
   a fourth resistor having a first end for receiving the working voltage, and a second end electrically connected with the output terminal of the comparator; and
   a fifth resistor having a first end electrically connected with the second end of the fourth resistor and the output terminal of the comparator, and a second end grounded.

* * * * *